United States Patent [19]

Hsu et al.

[11] Patent Number: 5,774,693

[45] Date of Patent: Jun. 30, 1998

[54] MULTIPROCESSOR PARALLEL COMPUTING DEVICE FOR APPLICATION TO THE EXECUTION OF A NUMERICAL SIMULATION SOFTWARE PROGRAM

[75] Inventors: Hsin-Chih Hsu; Kuang-Ping Ma, both of Taipei, Taiwan

[73] Assignee: Kaimei Electronic Corp., Taipei, Taiwan

[21] Appl. No.: 608,478

[22] Filed: Feb. 28, 1996

[51] Int. Cl.[6] .................................................. G06F 7/544
[52] U.S. Cl. .................................... 395/500; 395/800
[58] Field of Search ............................. 395/500, 800, 395/200.03; 364/222.2, 223, 228, 229, 230, 578, 230.4, 231.9

[56] References Cited

U.S. PATENT DOCUMENTS 5,072,371  12/1991  Benner et al. .................. 395/200.03
5,113,523   5/1992  Colley et al. ........................ 395/800
5,590,345  12/1996  Barker et al. ....................... 395/800
5,590,356  12/1996  Gilbert ............................... 395/800
5,606,517   2/1997  Traub et al. ........................ 364/578

*Primary Examiner*—Kevin J. Teska
*Assistant Examiner*—Dan Fiul
*Attorney, Agent, or Firm*—Jacobson, Price, Holman & Stern, PLLC

[57] ABSTRACT

A multiprocessor parallel computing device for application to the execution of a numerical simulation software program which includes an external computer, a main processor, a plurality of sub processors, and a DMA controller, and controlled to set up a parallel computing architecture in FDTD (finite difference time domain) and, which divides the computational domain into a plurality of equal cells, then distributes the values of the functions of the three components $E_x$, $E_y$, $E_z$, $H_x$, $H_y$, $H_z$ of the variables E and H of the domain to a plurality of sub processors thereof for computation so as to shorten FDTD computer simulation time.

6 Claims, 2 Drawing Sheets

MULTIPROCESSOR PARALLEL COMPUTING DEVICE FOR APPLICATION TO THE EXECUTION OF A NUMERICAL SIMULATION SOFTWARE PROGRAM

BACKGROUND OF THE INVENTION

The present invention relates to a multiprocessor parallel computing device for application to the execution of a numerical simulation software program which sets up a parallel computing architecture in FDTD (finite difference time domain) subject to the distribution of the values of the functions of the domain variables so as to effectively shorten the computer simulation time of the finite difference method in dividing computational domain into equal cells.

In recent years, numerical simulation has been intensively used as a tool in the application of engineering science. Numerical simulation can simulate the characteristics of a real product by a computer by means of try and error, simulating experimentation, for researching and analyzing the real state. Therefore, the application of numerical simulation can greatly shorten the actual experimenting time and reduces its cost, and greatly improve the accuracy of actual operation. More particularly, because of fast development in computer technology, it is an economical, rapid, and accurate experimenting method to simulate an experiment in mathematical model by means of the computing of a computer.

Among conventional numerical simulation methods, finite difference is one of the most popularly accepted methods in engineering industry. The method of finite difference is to divide computational domain into a plurality of cells or grids, and then to compute each cell or grid. However, if the computational domain is relatively greater, the divided grids will be relatively thinner, and the required computing time will be relatively longer. Therefore, it commonly takes several hours to complete one simulation program when a work station computer system is used.

Although the finite difference method has been utilized in electromagnetism, fluid dynamics, or thermal conduction science, it is still not popularly accepted in the application of numerical simulation. Because the processing of numerical simulation requires a work station computer system or parallel computing architecture type computer system, and because parallel computing architecture must be achieved by means of the application of a software in a parallel computer, the user needs to install an expensive parallel computer and the related software, and must be familiar with the writing manner of the software. Therefore, the method of finite difference is still not popularly used in numerical simulation nowadays.

SUMMARY OF THE INVENTION

The present invention has been accomplished to provide a multiprocessor parallel computing device for application to the execution of a numerical simulation software program which sets up a parallel computing architecture in FDTD (finite difference time domain) by means of a specially designed bus architecture and a plurality of sub-processors to divide the computational domain into a plurality of equal cells for computation so as to shorten FDTD computer simulation time.

It is one object of the present invention to provide a multiprocessor parallel computing device for application to the execution of a numerical simulation software program which uses a specially designed bus architecture and a plurality of sub-processors to proceed with parallel, synchronous computations so as to reduce the installation cost of conventional numerical simulation methods.

It is another object of the present invention to provide a multiprocessor parallel computing device for application to the execution of a numerical simulation software program which matches a specially designed bus architecture with a plurality of sub-processors to set up a parallel computing architecture by means of the application of a finite difference simulation software program through a distribution of the values of the functions of the domain variables so as to shorten FDTD computer simulation time.

DETAILED DESCRIPTION OF THE PREFERRED EMBODIMENT

The present invention provides a multiprocessor parallel computing device for application to the execution of a numerical simulation software program which sets up a parallel computing architecture in FDTD (finite difference time domain point) by means of the distribution of values of the functions of domain variable, so as to shorten FDTD computer simulation time.

Figure 1:
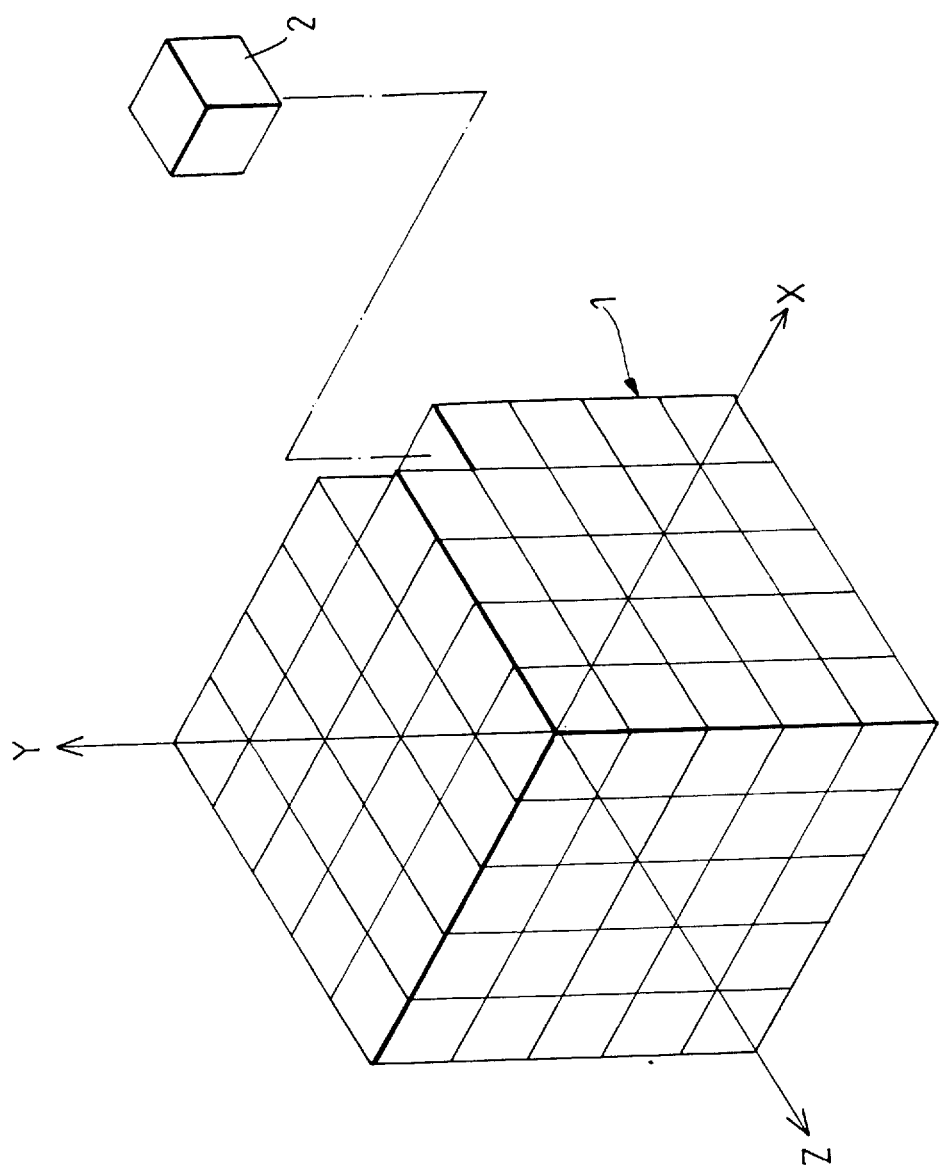
FIG. 1 is a schematic drawing showing a computational domain divided into a plurality of cells of equal size according to the present invention.

Referring to FIG. 1, the present invention is described hereinafter by way of an application example in a magnetic field simulation analysis. The domain 1 which is to be proceeded with a numerical simulation analysis is divided into a plurality of equal cells 2, then the components of the values of the respective electric field E and magnetic field H of each cell 2 at X-axis, Y-axis, and Z-axis in the three-dimensional space are calculated at every time point (T=0, 1, 2, 3, . . . n; n is an integer) as follows:

$$E_x^n, E_y^n, E_z^n \text{ and } H_x^n, H_y^n, H_z^n,$$

in which, because the component of the value of the electric field E or magnetic field H at a certain time point T=n is affected by the same component of the precedent time point T=n−1 and the other two components of the value of the same electric field or magnetic field at the precedent time point T=n−1, the components can be represented by the following functions:

$$E_x^n = f(E_x^{n-1}, H_y^{n-1}, H_z^{n-1})$$

$$E_y^n = f(E_y^{n-1}, H_x^{n-1}, H_z^{n-1})$$

$$E_z^n = f(E_z^{n-1}, H_x^{n-1}, H_y^{n-1})$$

$$H_x^n = f(H_x^{n-1}, E_y^{n-1}, E_z^{n-1})$$

$$H_y^n = f(H_y^{n-1}, E_x^{n-1}, E_z^{n-1})$$

$$H_z^n = f(H_z^{n-1}, E_x^{n-1}, E_y^{n-1})$$

Figure 2:
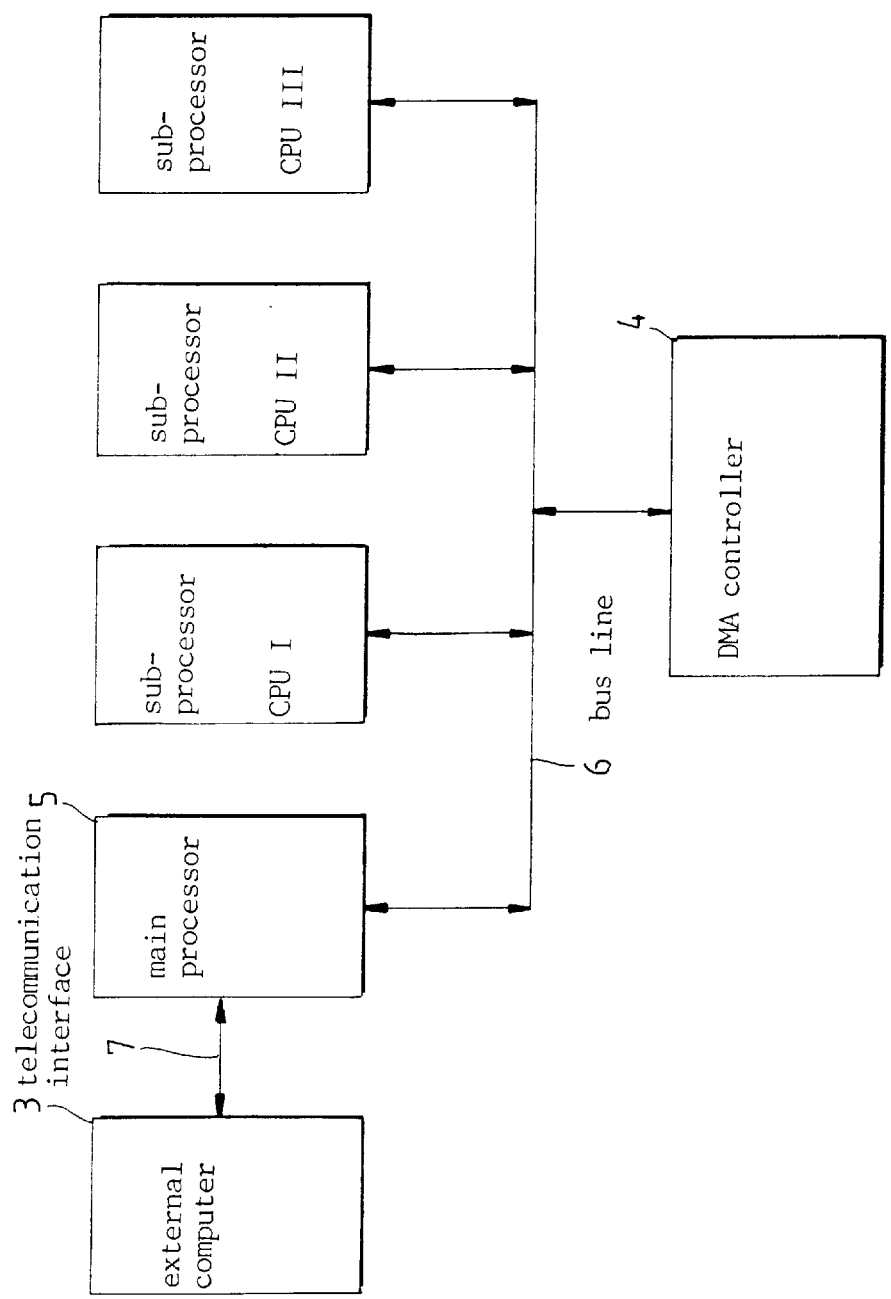
FIG. 2 is a block diagram showing the arrangement of a multiprocessor parallel computing device for the execution of a numerical simulation software program according to the present invention.

The present invention utilizes the distribution of the values of the aforesaid functions to shorten FDTD computer simulation time by means of the parallel computing device. Referring to FIG. 2, the hardware of the present invention comprises an external computer 3, a main processor 5, a plurality of sub-processors CPU-I, CPU-II, CPU-III, and a DMA (direct memory access) controller 4. The external computer 3 communicates with the main processor 5 through a telecommunication interface 7. The sub-processors CPU-I, CPU-II, CPU-III are respectively connected to the main processor 5 by a bus line 6.

The operation of the present invention is outlined hereinafter. When T=n, the function values of the three components $E_x$, $E_y$, $E_z$ of the electric field E or the three components $H_x$, $H_y$, $H_z$ are respectively distributed to the sub-processors CPU-I, CPu-III, CPU-II for computing, so as to further calculate the parameter value through an interchange computing. The interchange computing among the sub-processors CPU-I, CPU-II, CPU-III is controlled by the DMA controller 4. The present invention uses the preprocessor of the external computer 3 to compute the domain to be simulated so as to obtain the initial values of the three components of the electric field E or the magnetic field H (the $E^0$, $H^0$ value of each cell). The initial values thus obtained are sent to the main processor 5 through the telecommunication interface 7 for further processing. Upon receipt of the initial values, the main processor 5 drives the sub-processors CPU-I, CPU-II, CPU-III to compute the respective components of the electric field E and the magnetic field H of every single cell at every time point from T=1 to T=n (n is an integer, namely, the total of the time domains to be simulated), and collects the computation result of the sub processors. The computation result is then sent back to the external computer 3 by the main processor 5 through the telecommunication interface 7 for further analysis by the preprocessor software therein.

The computation procedure of every single cell of the simulating domain is outlined hereinafter.

(1) When T=0, the main processor 5 is controlled by the DMA controller 4 to send the three components $E_x^0$, $E_y^0$, $E_z^0$, $H_x^0$, $H_y^0$, $H_z^0$ of the electric field E and the magnetic field H to the sub processors CPU-I, CPU-II, CPU-III respectively, and at this stage, the content of the memory of each sub processor is as follows:

| CPU I | CPU II | CPU III |
|---|---|---|
| $Ex^0$ | $E_y^0$ | $E_z^0$ |
| $H_y^0$ | $H_z^0$ | $H_x^0$ |

(2) Before the computation of the value of each component when T=1, the DMA controller 4 proceeds with the duplication and transferring of the data contents of the memories of the sub-processors CPU-I, CPU-II, CPU-III, as shown below, so that the data stored in the memories of the respective sub-processors conform with the aforesaid relationship among the component functions.

| CPU I | CPU II | CPU III |
|---|---|---|
| $Ex^0$ | $E_y^0$ | $E_z^0$ |
| $H_y^0$ | $H_z^0$ | $H_x^0$ |
| $H_z^0$ | $H_x^0$ | $H_y^0$ |

(3) When the DMA controller 4 finishes the duplication and transferring of data, the sub-processors CPU-I, CPU-II, CPU-III compute the values of the respective components of the electric field at T=1, and then store the values thus obtained in the respective memories, and the contents of the memories of the sub processors CPU-I, CPU-II, CPU-III become as follows:

| CPU I | CPU II | CPU III |
|---|---|---|
| $Ex^0$ | $E_y^0$ | $E_z^0$ |
| $H_y^0$ | $H_z^0$ | $H_x^0$ |
| $H_z^0$ | $H_x^0$ | $H_y^0$ |
| $E_x^1$ | $E_y^1$ | $E_z^1$ |

(4) Then, the DMA controller 4 duplicates and transfers the data contents of the memories of the sub processors CPU-I, CPU-III, CPU-II through the bus line 6, as shown below, so that the data stored in the memories of the respective sub processors conform with the aforesaid relationship among the component functions.

| CPU I | CPU II | CPU III |
|---|---|---|
| $Ex^0$ | $E_y^0$ | $E_z^0$ |
| $H_y^0$ | $H_z^0$ | $H_x^0$ |
| $E_z^0$ | $E_x^0$ | $E_y^0$ |
| $E_x^1$ | $E_y^1$ | $E_z^1$ |

(5) When the DMA controller 4 finishes the duplication and transferring of the initial values $E_x^0$, $E_y^0$, $E_z^0$ of every component of the electric field E, the sub-processors CPU-I, CPU-II, CPU-III compute the values of the respective components of the magnetic field at T=1 as $H_x^1$, $H_y^1$, $H_z^1$ and then store the values thus obtained in the respective memories, and the contents of the memories of the sub-processors CPU-I, CPU-II, CPU-III become as follows:

| CPU I | CPU II | CPU III |
|---|---|---|
| $Ex^0$ | $E_y^0$ | $E_z^0$ |
| $H_y^0$ | $H_z^0$ | $H_x^0$ |
| $E_z^0$ | $E_x^0$ | $E_y^0$ |
| $E_x^1$ | $E_y^1$ | $E_z^1$ |
| $H_y^1$ | $H_z^1$ | $Hx^1$ |

(6) Then, the main processor 5 fetches the values of $E_x^1$, $E_y^1$, $E_z^1$, $H_x^1$, $H_y^1$, $H_z^1$ from the sub-processors CPU-I, CPU-II, CPU-II through the DMA controller 4, and then adjust the contents of the memories of the sub-processors CPU-I, CPU-III, CPU-III through the DMA controller to the following status:

| CPU I | CPU II | CPU III |
|---|---|---|
| $E_x^1$ | $E_y^1$ | $E_z^1$ |
| $H_y^1$ | $H_z^1$ | $H_x^1$ |

(7) By means of repeating the steps (2)–(6), the computation of every component of the electric field E and the magnetic field H of every single cell at every time point from T=2 to T-n is finished.

As indicated above, the computation of every cell of the simulating domain can be achieved by repeating the aforesaid steps from (1) to (7). If six sub-processors are installed, the computation of two single cells from T=1 to T=n can be simultaneously executed; if nine sub-processors are installed, the computation of three single cells from T=1 to T=n can be simultaneously executed; and so on. The sub-processors can be personal computers or units having the capability of computation and processing. The bus line can be a parallel bus line or serial bus line, or a network interface. The DMA controller can be a DMA chip, or a network servomechanism.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What the invention claimed is:

1. A multiprocessor parallel computing device for application to the execution of a numerical simulation software program, comprising an external computer, a main processor, a plurality of sub-processors, and a DMA (direct memory access) controller, said external computer communicating with said main processor through a telecommunication interface, said sub processors being respectively connected to said main processor by the bus line, the multiprocessor parallel computing device being controlled to proceed with a numerical simulation in analyzing a domain by computing the values of variables E and H of each equal cell being divided from said domain at every time point (T=0, 1, 2, 3, . . . n; n is an integer), the components of the values of the variables E and H at X-axis, Y-axis, Z-axis in a three-dimensional space being:

$$E_x^n, E_y^n, E_z^n \text{ and } H_x^n, H_y^n, H_z^n,$$

in which, the component of the values of the variables E or H at a particular time point T=n is affected by the same component of the precedent time point T=n−1 and the other two components of the values of the variable E or H at the precedent time point T=n−1, and the components can be represented by the following functions:

$$E_x^n = f(E_x^{n-1}, H_y^{n-1}, H_z^{n-1})$$

$$E_y^n = f(E_y^{n-1}, H_x^{n-1}, H_z^{n-1})$$

$$E_z^n = f(E_z^{n-1}, H_x^{n-1}, H_y^{n-1})$$

$$H_x^n = f(H_x^{n-1}, E_y^{n-1}, E_z^{n-1})$$

$$H_y^n = f(H_y^{n-1}, E_x^{n-1}, E_z^{n-1})$$

$$H_z^n = f(H_z^{n-1}, E_x^{n-1}, E_y^{n-1})$$

therefore, the variables of every equal cell of the domain is computed subject to the distribution of the values in said functions as:

(1) when T=0, said main processor is controlled by said DMA controller to store the initial values $E_x^0, E_y^0, E_z^0$, $H_x^0, H_y^0, H_z^0$ of the three components of the variables E and H in the memories of said sub-processors;

(2) before the computation of the value of each component when T=1, said DMA controller proceeds with the duplication and transferring of the data contents of the memories of said sub processors through said bus line, so that the data stored in the memories of the respective sub-processors conform with the aforesaid relationship among the component functions;

(3) when said DMA controller finishes the duplication and transferring of data, said sub-processors compute the values $E_x^1, E_y^1, E_z^1$ of the respective components of the variable E at T=1, and then store the values thus obtained in the respective memories;

(4) then, said DMA controller duplicates and transfers the data contents of the memories of said sub-processors through said bus line, so that the data stored in the memories of the respective sub processors conform with the aforesaid relationship among the component functions;

(5) when said DMA controller finishes the duplication and transferring of the initial values $E_x^0, E_y^0, E_z^0$ of every component of said variable E, said sub-processors compute the values $H_x^1, H_y^1, H_z^1$ of the respective components of the variable H at T=1, and then store the values thus obtained in the respective memories;

(6) then, said main processor fetches the values of $E_x^1, E_y^1, E_z^1, H_x^1, H_y^1, H_z^1$ from said sub processors through said DMA controller, and then adjust the contents of the memories of said sub processors through said DMA controller so as to conform with the relationship among the component functions;

(7) by means of repeating the aforesaid steps (2)–(6), the computation of every component of the variables E and G of every equal cell of the domain at every time point from T=2 to T-n is finished; by means of repeating the aforesaid steps from (1) to (7), the computation of every cell of the domain is finished.

2. A multiprocessor parallel computing device for application to the execution of a numerical simulation software program of claim 1 wherein said variables E and H are can be electric field and magnetic field.

3. The multiprocessor parallel computing device for application to the execution of a numerical simulation software program of claim 1 wherein the computation of two equal cells from T=1 to T=n are simultaneously executed when six sub-processors are installed; the computation of three equal cells from T=1 to T=n are simultaneously executed when nine sub processors are installed.

4. The multiprocessor parallel computing device for application to the execution of a numerical simulation software program of claim 1 wherein said sub-processors can be personal computers or units having the capability of computation and processing.

5. The multiprocessor parallel computing deice for application to the execution of a numerical simulation software program of claim 1 wherein said bus lines can be a parallel bus line or serial bus line, or a network interface.

6. The multiprocessor parallel computing device for application to the execution of a numerical simulation software program of claim 1 wherein said DMA controller can be a DMA chip, or a network servomechanism.

* * * * *